US005304964A

United States Patent [19]

DiMarco

[11] Patent Number: 5,304,964

[45] Date of Patent: Apr. 19, 1994

[54] ELECTRICAL CONNECTOR INCORPORATING GROUND SHIELD SPACER

[75] Inventor: Mario DiMarco, Scottsdale, Ariz.

[73] Assignee: Honeywell Inc., Minneapolis, Minn.

[21] Appl. No.: 1,995

[22] Filed: Jan. 8, 1993

[51] Int. Cl.[5] ........................ H03H 7/01; H01R 13/66

[52] U.S. Cl. .................................... 333/181; 333/182; 333/185; 439/620

[58] Field of Search ................................ 333/181-185, 333/12; 439/607, 608, 620; 361/312

[56] References Cited

U.S. PATENT DOCUMENTS 4,699,590 10/1987 Farrar et al. .................... 439/620 X
4,747,789 5/1988 Gliha .............................. 333/185 X
5,066,931 11/1991 Thelissen ............................ 333/182
5,071,369 12/1991 Denlinger et al. .................. 439/595
5,081,434 1/1992 Sakamoto et al. .................. 333/182
5,190,479 3/1993 Jordi .............................. 333/185 X
5,268,810 12/1993 DiMarco et al. ............... 333/182 X

*Primary Examiner*—Seungsook Ham
*Attorney, Agent, or Firm*—C. G. Mersereau; D. E. Jepsen; R. E. Champion

[57] ABSTRACT

A connector has been designed that incorporates a ground EMI/RFI shield spacer in conjunction with an attached grounded multi-coplanar capacitor board to achieve an EMI/RFI tight grounded connection. The shield spacer may be provided with further RF suppression core members which surrounds all of the signal lines and power connections connected via the plug.

9 Claims, 1 Drawing Sheet

ELECTRICAL CONNECTOR INCORPORATING GROUND SHIELD SPACER

BACKGROUND OF THE INVENTION

I. Cross-Reference to Related Application

Cross reference is made to related applications Ser. No. 08/002,296 to Timothy J. Wilhelm entitled "MULTI-COPLANAR CAPACITOR FOR ELECTRICAL CONNECTOR", and Ser. No. 08/002,197 (U.S. Pat. No. 5,268,810) to Mario DiMarco and Timothy J. Wilhelm entitled "ELECTRICAL CONNECTOR INCORPORATING EMI FILTER" and both filed of even date and assigned to the same assignee as the present application.

II. Field of the Invention

This invention relates generally to electrical connectors for connecting electrical devices or parts to a cable harness, and more particularly to a connector assembly incorporating active and passive circuit elements for effectively isolating the electrical assembly with which the connector is used from electromagnetic interference (EMI), radio frequency interference (RFI), and particularly high intensity radio frequency (HIRF).

III. Discussion of the Prior Art

Present-day commercial and military aircraft incorporate highly complex electronic control systems incorporating numerous sensors and force transducers and servo systems as well as the electronics necessary for processing the sensor signals and developing the requisite control signals for the transducers and the like so that the aircraft can be flown in a controlled manner. Typically, the electronic assemblies involved will be housed in metallic shielding enclosures or boxes which are adapted to slide into equipment racks on the aircraft. Each of the electronic modules will typically incorporate a receptacle having a large number of terminal pins arranged in a grid pattern and which are appropriately wired to the electronic componentry within the shielded enclosure. Incorporated into the rack assembly is a plug member which is adapted to mate with the receptacle on the box housing the electronics module. The pins of the plug are typically connected to conductors in a wiring harness leading off to other electronic equipment which may be spread throughout the aircraft.

One standard plug used throughout the aircraft industry is referred to as the ARINC 600 plug, which meets the ARINC specifications for air transport avionics equipment interfaces. That specification, among other things, defines the number of pins, their location, the pin spacing and the shell dimensions for the plug. Those desiring more specific information relative to the plug are referred to the ARINC 600 specification itself.

The ARINC 600 plug is designed to mate with a receptacle attached to or formed into a wall of the shielding enclosure in which the electronics are contained. The ARINC 600 plug includes three sections with sections A and B incorporating 150 male pins, each disposed in a grid array of rows and columns. Section C includes a smaller number of pins which, generally speaking, provide the power connections to the electronics module. The existing receptacle, designed to accept the plug, includes a plurality of terminal pins having female sockets on one end and male wire wrap terminals or solder points on the other end. The pins are arranged in the same grid array, such that when the plug is inserted into the receptacle, the male pins of the plug engage the female sockets of the receptacle's terminal pins. The male portion of the receptacle's terminal pins then connect to the wiring for the electronics within the shielded enclosure.

One drawback of the prior art connectors such as the ARINC 600 connector design is that they do not provide the necessary immunity of the electronic circuitry from the effects of EMI and RFI and more particularly HIRF radiation. EMI/RFI and HIRF radiation in proximity to the module may find its way into the interior of the shielded enclosure via the connector assembly. These RFI/EMI sources may result in the electronic controls issuing erroneous data to the other electronic equipment with which it is associated, resulting in loss of control over the aircraft.

While filtering and transient suppression circuits have been devised for dealing with RFI/EMI radiation, physical space constraints may preclude inclusion of such circuitry within the electronics module. A need, therefore, exists for a connector plug receptacle assembly which has an efficient high energy ground associated with a shield or filtering device which combines an efficient shield for the EMI/RFI frequencies and HIRF of interest with an excellent chassis ground.

OBJECTS

It is accordingly a principal object of the present invention to provide an improved connector assembly for an enclosure containing an improved grounded shield to eliminate EMI, RFI or HIRF interfering energy.

Another object of the invention is to provide an improved connector receptacle or plug which can mate with an industry standard fitting and which incorporates an improved grounded shield for limiting various forms of electromagnetic radiation from deleteriously affecting the operation of the control electronics.

Another object of the invention is to provide an improved receptacle containing a large plurality of terminal pins which will mate with an industry standard plug and in which EMI/RFI are effectively filtered for each pin, but where the connector receptacle will still fit in the space allocated for it on the electronics module.

A still further object of the invention is to provide a connector receptacle of the type described which directly contacts the associated PWB and PWB ground system.

SUMMARY OF THE INVENTION

The foregoing features and objects of the invention are achieved by providing an electrical connector receptacle or plug for use with electronic apparatus contained within a shielding enclosure. While the detailed embodiment is designed to mate with an industry standard rectangular plug, it is contemplated that a plug of any shield configuration of the type having a plurality of male pins arranged in a grid of rows and columns where the male pins are electrically and mechanically joined to a multi-conductor wiring harness can be used. Of course, it should be understood that the receptacle of the invention could be a male plug and that the filtering and suppression system can be placed in any convenient location including the harness plug itself. The concept is that the connection be made in a manner such that undesirable EMI, RFI and HIRF are filtered and excluded across the connection and the particular placement of the ground shield spacer is not meant to be limiting.

The connector receptacle is in the form of a conductive shell mounted in a wall of the shielding enclosure. The shell in the rectangular or box-like embodiment has four mutually perpendicular side walls defining a housing cavity with open front and rear faces. The housing cavity is dimensioned to receive the aforementioned industry standard plug when it is inserted through the open front face of the shell. Affixed to the shell, proximate its open rear face, is a removable frame which supports a flat substrate containing a plurality of socket contacts arranged in the same grid pattern of rows and columns as is used for the male pins on the plug. The substrate also includes a plurality of terminal pins fitted into the socket contacts where the terminal pins project outwardly and rearwardly with respect to the shell and thereby provide the points which are directly connected to the wiring of the PWB electronic apparatus within the enclosure.

The connector or plug of the invention includes a generally rectangular shell or housing of electrically conducting material provided with a suitable substantial chassis ground and plated where indicated to minimize corrosion during the life of the receptacle. The rear portion of the connector housing or shell is designed to be connected to a grounding, shielding and spacing module which is in the form of a frame having substantially parallel opposed major surfaces spaced by the thickness of the module, the shield/spacer having peripheral sides and internal hollow cutouts in accordance with the same grid pattern used for the terminal pins on the plug and socket connection systems. The shield/spacer is sandwiched between the connector housing and an associated connected multi-coplanar capacitor (MCC) system configured much like a printed wiring board (PWB). The MCC/PWB further filters other frequencies of RFI. The cavities of the hollow cutouts in the shield/spacer are adapted to receive and contain cores which may be a ferrite material which is used with the well-known PWB built-in layered capacitance to filter the targeted frequency range necessary by surrounding each electrical contact.

The shield/spacer is used as a shield for any EMI or HIRF energy from the electromagnetic spectrum. This is achieved by essentially sealing the rear of the connector from the outside world by providing a very low impedance ground path which guarantees that there will no apertures at any point along the mating surfaces large enough for EMI or HIRF radiation to pass through. This is further accomplished by making the plug receptacle of the invention an integral component between the connector shell and the MCC/PWB.

The ground/shield/spacer (GSS) of the invention can be fabricated from a conductive material or plated with a conductive material that resists corrosion and assures good electrical low to microwave frequency contact on the mating surfaces for the life of the product. The plating considered can be cadmium, silver, nickel or any other plating which minimizes galvanic reactions with the mating surfaces. This provides a firm and complete grounding contact between the grounded edges of the MCC/PWB and the ground shield spacer. The construction of the MCC/PWB is described in more detail in the above-referenced copending application to Wilhelm.

The preferred method of assembly of the system with reference to an array of connector contact tails or male terminals which are associated with the plug and the PWB includes positioning the ferrite cores over the connector male terminals and thereafter overlaying the GSS over the cores and connecting to the connector shell. The next component assembled is the PWB itself which is electrically connected to each male terminal or contact tail by either standard soldering techniques or compliant pin or any other method of making electrical connection to PWBs which is desired. Thereafter the entire assembly is secured with screws or the like through the PWB into the connector shell such that it makes a tight well-grounded unit. In addition, conductive gasket material (not shown) may be used to seal the spacer between adjacent parts if desired in a well-known manner.

The present invention then contemplates a feed-through module which combines an EMI/HIRF shield and ground system in one module that can be directly attached to a PWB. The feed-through module permits an industry standard plug, e.g., the ARINC 600 plug, to mate with the receptacle that can be tailored to re any desired plug.

BRIEF DESCRIPTION OF THE DRAWINGS

The foregoing features, objects and advantages of the invention will become apparent to those skilled in the art from the following detailed description of a preferred embodiment especially when considered in conjunction with the accompanying drawings in which like numerals in the several views refer to corresponding parts.

DESCRIPTION OF THE PREFERRED EMBODIMENT

Figure 1:
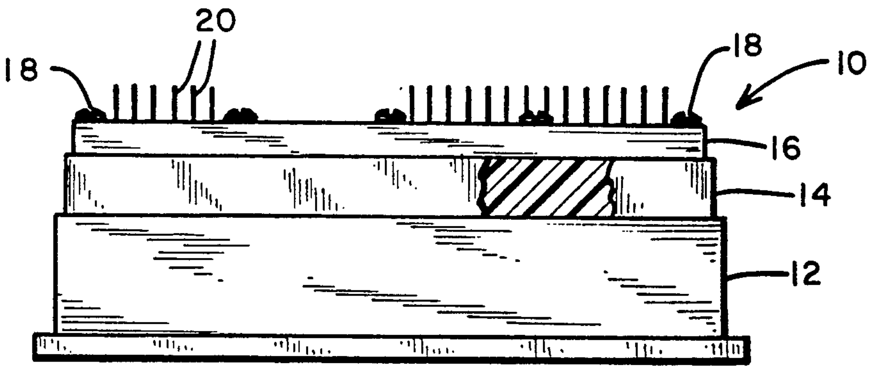
FIG. 1 is a side elevation view of the connector receptacle of the invention connected to a PWB.

With first reference to FIG. 1, there is shown generally at 10 a side elevational view of a receptacle of the invention assembled together with a PWB in accordance with the invention. The assembled system includes an electrically conductive housing or shell 12 which may be made out of any suitable material and provided with an electrically conductive surface and a plating, where necessary, to minimize corrosion throughout the life of the receptacle. The combination ground shield spacer of the invention is shown at 14 and a connected MCC/PWB, at 16. The assembled system is held tightly together by an array of fasteners which may be screws as at 18. The connector contact tails or male terminals which are electrically connected to the MCC/PWB and carry signals associated with the plug for which the receptacle of the invention is adapted to receive as shown at 20.

While perhaps not apparent from the view of FIG. 1, as will be appreciated by those skilled in the art, in many applications, such as in aircraft control systems, space is very much at a premium. Thus, the circuit containing modules are made as small as possible consistent with the density of the printed circuit boards and the temperature constraints imposed on the electronic circuit components. The PWB may typically slide into a rack having a male connector plug projecting from a surface thereof to mate with the receptacle 10. The plug (not shown) comprises a termination of a multi conductor cable or wiring harness which leads to remote areas of the aircraft, ship, etc., containing the other equipment and input sensors.

As is set forth in the introductory portions of this specification, it is imperative that the electronics contained within the PWB be rendered immune from emitting erroneous control information, via the aforementioned multi-conductor cable leading to the controlled structures due to the introduction of EMI/RFI and HIRF, etc. through the connector. Thus, it is imperative that the electronic components be isolated from radio frequency interference.

For the most part, the system is effectively grounded when in position in an enclosure on an equipment rack and the enclosure acts as a shield preventing EMI/RFI from penetrating and reaching the sensitive electronic components. However, if such EMI/RFI and HIRF radiation are able to penetrate the enclosure via the connector, the circuitry can be impacted and caused to emit wrong information.

To obviate this possibility, it might be possible to incorporate appropriate filter circuitry and high voltage transient suppression circuitry which is operatively coupled to the conductors joining the connector or terminal pins 20. However, when space is at a premium, this may not be an effective solution in that there is simply not sufficient room for the required filtering and transient suppression circuitry.

In accordance with the present invention, that function is primarily assumed by the components operatively disposed within the confines of the connector receptacle 10. The way in which this is accomplished will next be explained with the aid of the blown-apart drawing of FIG. 2.

Figure 2:
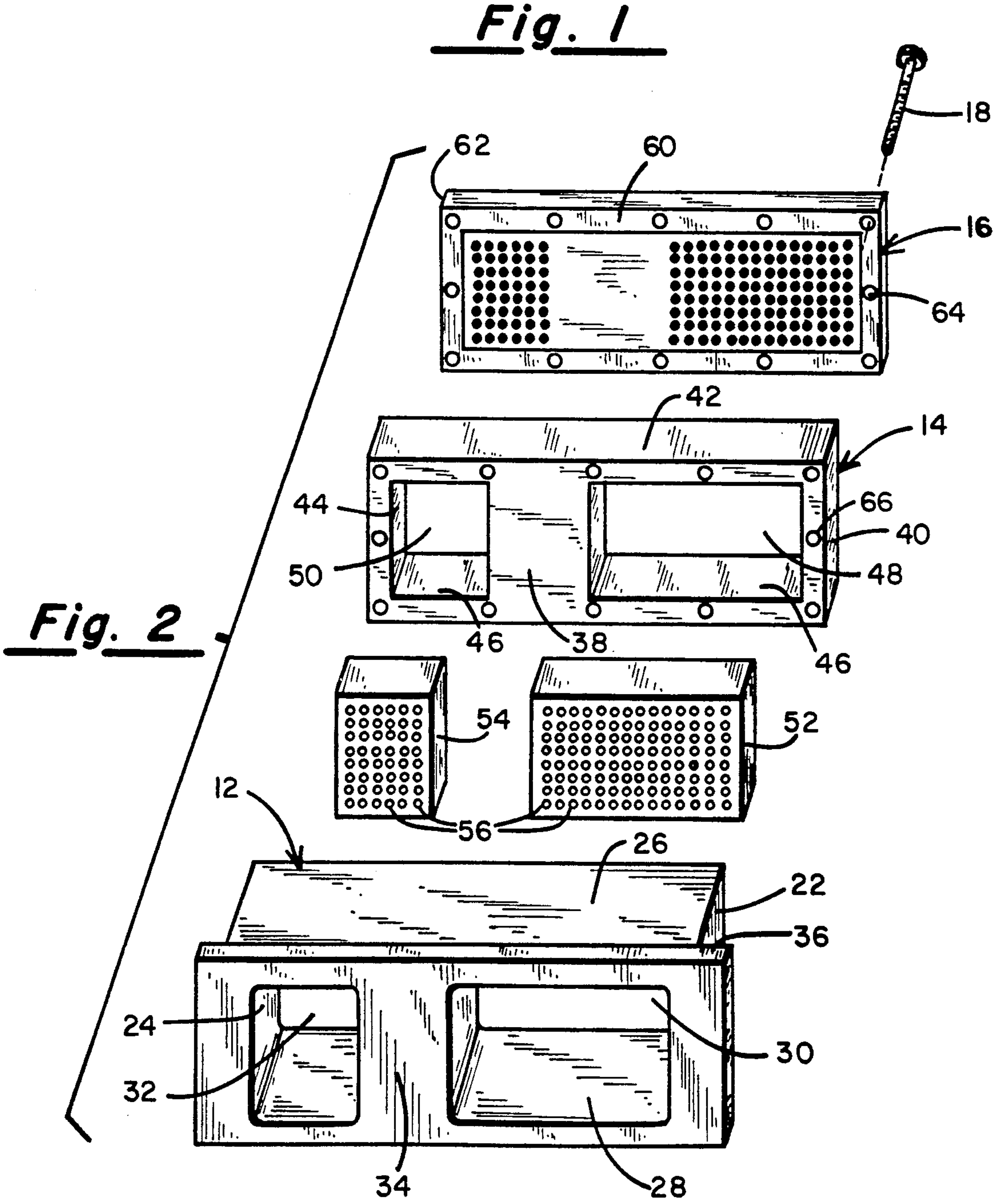
FIG. 2 is an exploded view of the electrical connector assembly in accordance with the present invention.

Referring to FIG. 2, the connector receptacle is seen to comprise a shell member 12 having a pair of opposed side walls as shown at 22 and 24, a top wall 26 and a bottom wall 28. These four walls define two housing cavities 30 and 32 which are separated from one another by a transverse rib 34. The shell 12 is preferably fabricated from a high grade aluminum alloy suitable for being forged or die cast, but other conductive metals may also be used.

Integrally formed with and surrounding the perimeter of the shell 12 at the front face thereof is an outwardly extending flange 36. The flange may be used to fix the receptacle system to a chassis or rack or other electrical module or system as desired.

Affixed to the rear perimeter of the shell 12 is a rectangular frame in the form of a grounding, shielding and spacing or ground/shield/spacer module 14 having substantially parallel opposed major surfaces, one of which is shown at 38, spaced by the thickness of the module, the shield spacer having peripheral sides 40, 42, 44, 46 and internal hollow cutouts 48, 50 in accordance with accommodating the same grid pattern used for the terminal pins on the plug and socket connection systems. The ground/shield/spacer is sandwiched between the connector housing an associated connected multi-coplanar capacitor (MCC) using printed wiring board PWB construction 16. The cavities of the hollow cutouts 48 and 50 in the shield/spacer are adapted to receive and contain respective cores 52 and 54 which may be a ferrite material which operates in conjunction with the well-known built-in multi-coplanar capacitor filtering and grounding system of the MCC/PWB more thoroughly explained in the above cross-referenced Wilhelm application Ser. No. 08/002,296 to filter the targeted frequency range necessary by surrounding each electrical contact which traverses an opening 56.

The shield spacer is used as a shield for any EMI or HIRF energy from the electromagnetic spectrum. This is achieved by essentially sealing the rear of the connector from the outside world by providing a very low impedance to ground path and which guarantees that there will no apertures at any point along the mating surfaces large enough for EMI or HIRF radiation to pass through.

The above is further accomplished according to the invention by making the plug receptacle of the invention an integral component of a system including the connector shell and the MCC/PWB 16. The MCC/PWB 16 contains an array of separate capacitors each of which is located between two metal ground planes and is connected to one of the male terminal pins 20 so that each pin terminal has an associated capacitor (not shown) and all the ground planes or levels of the many layered PWB are commonly terminated in a peripheral conductor (preferably copper) clad outer edge as at 60 (FIG. 1) which also encompasses the depth of the MCC/PWB at 62. This common ground is held firmly against rear conducting surface of the ground shield spacer when the system is tightly assembled together. The system is held together using threaded fasteners 18 which extend through consecutive aligned openings as at 64 and 66 and are held in threaded recesses in the housing 12 (not shown) in a well-known manner. The pin terminals 20 protrude behind the MCC/PWB 16 and thus are not shown in FIG. 2. Of course, as discussed above, in the MCC/PWB there is a capacitive filter at some level associated with each terminal or signal line in the multi-coplanar capacitor and grounding system.

The order of assembly of the system includes positioning the ferrite cores 52 and 54 over the connector male terminals and thereafter overlaying the ground shield spacer 14 over the cores and connecting to the connector shell. Next the MCC/PWB itself is electrically connected to each male terminal or contact tail by either standard soldering techniques or compliant pin or any other 5 method of making electrical connection to PWBs which is desired. Thereafter the entire assembly is secured with the screws 18 or the like through the PWB into the connector shell such that it makes a tight well-grounded unit.

This invention has been described herein in considerable detail in order to comply with the Patent Statutes and to provide those skilled in the art with the information needed to apply the novel principles and to construct and use embodiments of the example as required. However, it is to be understood that the invention can be carried out by specifically different devices and that various modifications can be accomplished without departing from the scope of the invention itself. For example, while the connector of the invention has been described with particular reference to a rectangular shape and a female connector, it will be recognized that the invention is applicable equally with respect to a plug or receptacle of any shape, to a male rather than female configuration and may be incorporated in the harness plug member rather than the receptacle.

I claim:

1. An electrical connector receptacle for allowing connection of electronic apparatus contained within a shielded enclosure to a multi-conductor wiring harness terminating in an plug of the type having a plurality of male pins arranged in a grid of rows and columns, the connector receptacle comprising:

(a) a conductive shell defining a housing cavity having open front and rear faces, the housing cavity dimensioned to receive the plug when inserted through the open front face;

(b) a ground EMI/RFI shield spacer in the form of an open faced frame member having a conductive surface and removably attached to the shell proximate the open rear face of the shell and having substantially parallel opposed major peripheral front and rear surfaces containing cutouts arranged to include the grid areas of the pattern of rows and columns of connectors;

(c) a multi-coplanar capacitor board having a surface abutting the rear surface of the ground shield spacer and removably attached thereto having a plurality of socket contacts arranged to receive the connector pins of the male plugs and having ground planes connected to a common ground conductor attached to the surface abutting the ground shield spacer;

(d) a plurality of terminal pins joined to the socket contacts and the multi-coplanar capacitor board; and (e) wherein the connector receptacle forms a structure which provides a grounded EMI/RFI barrier.

2. The electrical connector of claim 1 further comprising HIRF suppression core means in the ground shield spacer frame member surrounding each of the connector terminal pins to aid in suppression of desired RF frequencies.

3. The electrical connector of claim 2 wherein the core means comprises ferrite cores.

4. An electrical connector receptacle for allowing connection of electronic apparatus contained within a shielded enclosure to a multi-conductor wiring harness terminating in an industry standard plug connection of interest of the type having a plurality of male pins arranged in a grid of rows and columns, the connector receptacle comprising:

(a) a generally rectangular, box-like conductive shell having mutually perpendicular side walls defining a housing cavity having open front and rear faces, the housing cavity dimensioned to receive the plug when inserted through the open front face;

(b) a ground EMI/RFI shield spacer open-faced frame member having a conductive surface, removable attached to the shell proximate the open rear face of the shell, and having substantially parallel opposed major peripheral front and rear surfaces containing cutouts arranged to include the grid areas of the pattern of rows and columns of the connectors of interest;

(c) a multi-coplanar capacitor board having a surface abutting the rear surface of the ground shield spacer and removably attached thereto having a plurality of socket contacts arranged to receive the connector pins of the male plugs and having ground planes connected to a common conductor attached to the surface abutting the ground shield spacer;

(d) a plurality of terminal pins joined to the socket contacts and the multi-coplanar capacitor board; and (e) wherein the connector receptacle forms a structure which provides a grounded EMI/RFI barrier.

5. The electrical connector of claim 4 further comprising HIRF suppression core means in the ground shield spacer frame member surrounding each of the connector terminal pins to aid in suppression of desired RF frequencies.

6. The electrical connector of claim 5 wherein the core means comprises ferrite cores.

7. An electrical connector for connecting electronic apparatus contained within a shielded enclosure to a multi-conductor wiring harness using a plug/socket arrangement of the type having a plurality of pins and sockets arranged in a grid of rows and columns, comprising:

(a) a conductive shell defining a housing cavity having open front and rear faces, the housing cavity dimensioned to contain a pin or socket configuration within the open front face;

(b) a grounding, EMI/RFI shielding and spacing means in the form of an open faced frame member having a conductive surface and removably attached to the shell proximate the open rear face of the shell and having substantially parallel opposed major peripheral front and rear surfaces containing cutouts arranged to include the grid areas of the pattern of rows and columns of connectors;

(c) a multi-layer, multi-coplanar capacitor board having a surface abutting the rear surface of the grounding, shielding and spacing means and removably attached thereto having a plurality of pin or socket contacts arranged to receive counterpart sockets or pins having a ground plane associated with each connector and having ground planes connected to a common ground conductor attached to the surface abutting the ground shield spacer;

(d) a plurality of terminal pins and socket contacts having grounding, shielding, and spacing means configured to connect with the multi-coplanar capacitor board; and (e) wherein the electrical connector structure provides a grounded EMI/RFI barrier.

8. The electrical connector of claim 7 further comprising HIRF suppression core means in the ground shield spacing frame member surrounding each of the connector terminal pins to aid in suppression of desired RF frequencies.

9. The electrical connector of claim 8 wherein the core means comprises ferrite cores.

* * * * *